(12) United States Patent
Nguyen et al.

(10) Patent No.: US 8,395,434 B1
(45) Date of Patent: Mar. 12, 2013

(54) LEVEL SHIFTER WITH NEGATIVE VOLTAGE CAPABILITY

(75) Inventors: Qui Vi Nguyen, San Jose, CA (US); Takuya Ariki, Naka-ku (JP); Jongmin Park, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/253,784

(22) Filed: Oct. 5, 2011

(51) Int. Cl.
*H03L 5/00* (2006.01)

(52) U.S. Cl. .............................. 327/333; 326/63; 326/81
(58) Field of Classification Search .................. 327/318, 327/319, 333; 326/62, 63, 83, 80, 81
See application file for complete search history.

(56) References Cited

U.S. PATENT DOCUMENTS

| | | | |
|---|---|---|---|
| 4,161,633 A | 7/1979 | Treiber | |
| 4,580,067 A | 4/1986 | Proebsting | |
| 4,678,941 A | 7/1987 | Chao et al. | |
| 4,954,731 A | 9/1990 | Dhong et al. | |
| 5,436,587 A | 7/1995 | Cernea | |
| 5,512,845 A | 4/1996 | Yuh | |
| 5,570,315 A | 10/1996 | Tanaka et al. | |
| 5,723,985 A | 3/1998 | Van Tran et al. | |
| 5,790,453 A | 8/1998 | Chevallier | |
| 5,903,495 A | 5/1999 | Takeuchi et al. | |
| 5,912,838 A | 6/1999 | Chevallier | |
| 5,940,333 A | 8/1999 | Chung | |
| 5,966,331 A | 10/1999 | Shiau et al. | |
| 6,020,778 A | 2/2000 | Shigehara et al. | |
| 6,044,012 A | 3/2000 | Rao et al. | |
| 6,046,935 A | 4/2000 | Takeuchi et al. | |
| 6,078,518 A | 6/2000 | Chevallier | |
| 6,154,085 A | 11/2000 | Ramakrishnan | |
| 6,166,982 A | 12/2000 | Murray et al. | |
| 6,169,432 B1 | 1/2001 | Sharpe-Geisler | |
| 6,242,962 B1 * | 6/2001 | Nakamura | 327/333 |
| 6,351,158 B1 | 2/2002 | Shearon et al. | |
| 6,359,496 B1 | 3/2002 | Steinhagen | |
| 6,370,075 B1 | 4/2002 | Haeberli et al. | |

(Continued)

FOREIGN PATENT DOCUMENTS

| | | |
|---|---|---|
| EP | 0 475 407 | 3/1992 |
| JP | 02 034022 A | 2/1990 |

(Continued)

OTHER PUBLICATIONS

U.S. Appl. No. 12/973,493, filed Dec. 20, 2010, 28 pages.

(Continued)

*Primary Examiner* — Hai L Nguyen
(74) *Attorney, Agent, or Firm* — Davis Wright; Tremaine LLP

(57) ABSTRACT

A level shifter circuit is presented that can apply a negative voltage level to non-selected blocks while still being able to drive a high positive level when selected. An exemplary embodiment presents a negative level shifter that is not susceptible to low voltage pfet breakdown. This allows for a high voltage level shifter (transfer gate) that can drive a negative level for unselected blocks and, when enabled for a selected block, can still drive a positive high voltage level. By using a pair of low voltage PMOS device whose n-wells share the same level as other PMOS transistors in the design, layout area can be minimized. The gates of this pair of PMOSs are connected to VSS, thereby preventing these low voltage PMOS devices from thin oxide breakdown.

14 Claims, 6 Drawing Sheets

U.S. PATENT DOCUMENTS

| | | | |
|---|---|---|---|
| 6,483,366 | B2 | 11/2002 | Ho |
| 6,492,860 | B1 | 12/2002 | Ramakrishnan |
| 6,556,465 | B2 | 4/2003 | Haeberli et al. |
| 6,696,880 | B2 | 2/2004 | Pan et al. |
| 6,717,851 | B2 | 4/2004 | Mangan et al. |
| 6,760,262 | B2 | 7/2004 | Haeberli et al. |
| 6,922,096 | B2 | 7/2005 | Cernea |
| 7,030,683 | B2 | 4/2006 | Pan et al. |
| 7,053,689 | B2 | 5/2006 | Kim |
| 7,135,910 | B2 | 11/2006 | Cernea |
| 7,368,979 | B2 | 5/2008 | Govindu et al. |
| 7,400,171 | B1 | 7/2008 | Montazer |
| 7,492,206 | B2 | 2/2009 | Park et al. |
| 7,515,503 | B2 | 4/2009 | Lee et al. |
| 7,554,311 | B2 | 6/2009 | Pan |
| 7,592,858 | B1 | 9/2009 | Jung |
| 7,609,554 | B2 | 10/2009 | Tanzawa |
| 7,795,952 | B2 | 9/2010 | Lui et al. |
| 7,816,969 | B2 * | 10/2010 | Yoo ................................ 327/333 |
| 8,004,340 | B2 | 8/2011 | Guo et al. |
| 8,098,088 | B1 | 1/2012 | Sutandi et al. |
| 8,106,701 | B1 * | 1/2012 | Huynh et al. .................. 327/333 |
| 2006/0114737 | A1 | 6/2006 | Terasawa et al. |
| 2007/0109862 | A1 | 5/2007 | Kim |
| 2007/0126494 | A1 | 6/2007 | Pan |
| 2007/0133300 | A1 | 6/2007 | Tanzawa |
| 2007/0139077 | A1 | 6/2007 | Park et al. |
| 2007/0139099 | A1 | 6/2007 | Pan |
| 2007/0268774 | A1 | 11/2007 | Lee et al. |
| 2008/0198667 | A1 | 8/2008 | Hosomura et al. |
| 2009/0058506 | A1 | 3/2009 | Nandi et al. |
| 2009/0058507 | A1 | 3/2009 | Nandi et al. |
| 2009/0058508 | A1 | 3/2009 | Lin |
| 2009/0097312 | A1 | 4/2009 | Binboga |
| 2009/0153230 | A1 | 6/2009 | Pan et al. |
| 2009/0153232 | A1 | 6/2009 | Fort et al. |
| 2009/0302930 | A1 | 12/2009 | Pan et al. |
| 2009/0315616 | A1 | 12/2009 | Nguyen et al. |
| 2009/0322413 | A1 | 12/2009 | Huynh et al. |
| 2010/0019832 | A1 | 1/2010 | Pan |
| 2010/0067300 | A1 | 3/2010 | Nakamura |
| 2010/0080063 | A1 | 4/2010 | Nakagawa |
| 2010/0309720 | A1 | 12/2010 | Liu et al. |
| 2011/0018615 | A1 | 1/2011 | Pan |

FOREIGN PATENT DOCUMENTS

| | | |
|---|---|---|
| JP | 3-41694 | 2/1991 |
| JP | 9-139079 | 3/1997 |
| JP | 11-126478 | 5/1999 |

OTHER PUBLICATIONS

U.S. Appl. No. 12/973,641, filed Dec. 20, 2010, 26 pages.
U.S. Appl. No. 12/833,167, filed Jul. 9, 2010, 55 pages.
Feng Pan., "Charge Pump Circuit Design," McGraw-Hill, 2006, 26 pages.
Pylarinos et al., "Charge Pumps: An Overview," Department of Electrical and Computer Engineering, University of Toronto, Proceedings of Symposium May 2003, 7 pages.
Notification of Transmittal of the International Search Report and the Written Opinion of the International Searching Authority, or the Declaration for International Application No. PCT/US2012/057301 mailed Jan. 23, 2013, 15 pages.

* cited by examiner

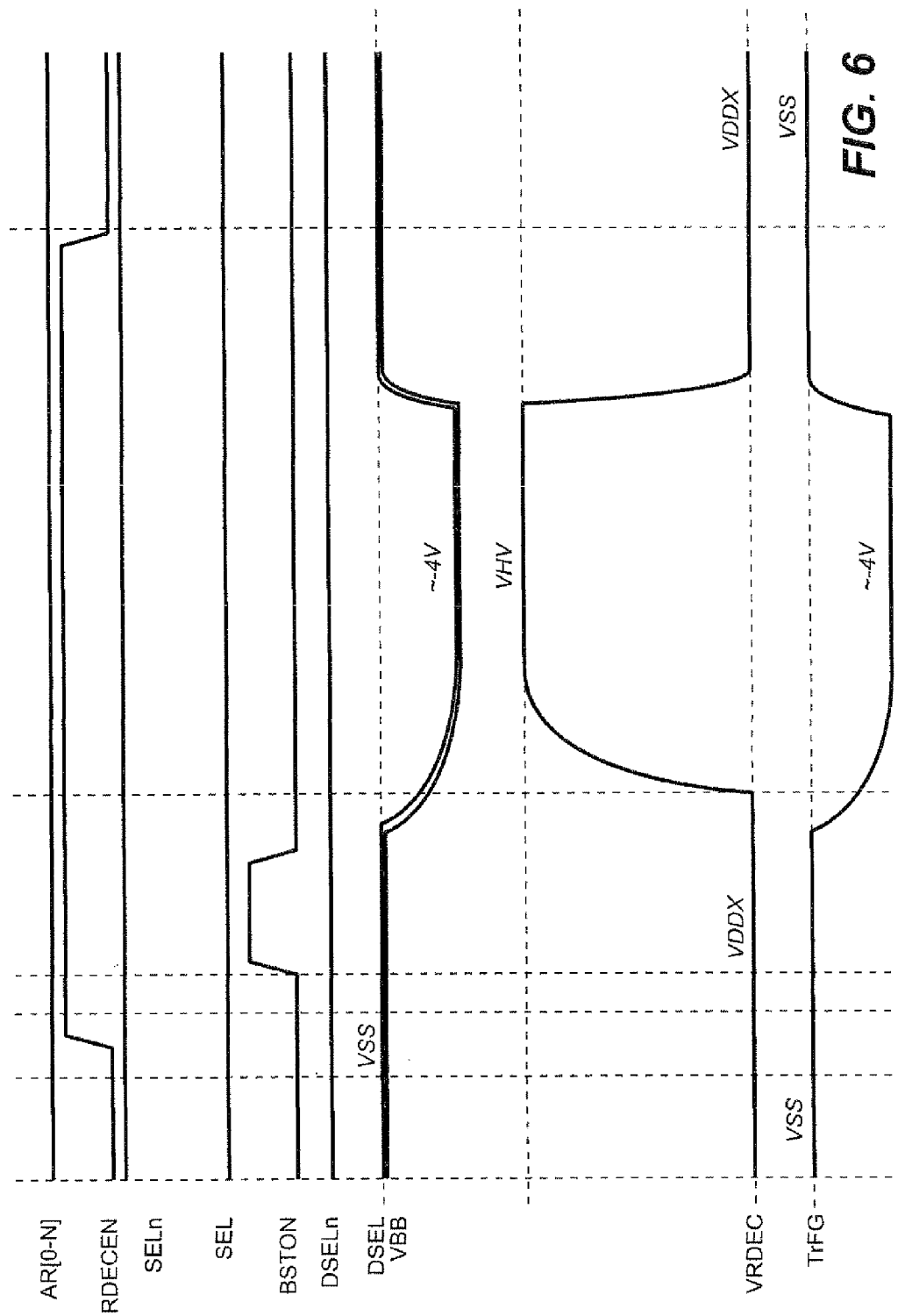

US 8,395,434 B1

LEVEL SHIFTER WITH NEGATIVE VOLTAGE CAPABILITY

BACKGROUND

1. Field of the Invention

This application relates generally to integrated circuit semiconductor devices, and, more specifically, to level shifting circuits that can supply also negative voltages.

2. Background Information

In an integrated circuit, it is common to need a circuit to provide a voltage from a source to an output in response to an input signal. An example is a word line decoding circuit of in a non-volatile memory. In such a circuit, a relatively high programming voltage is supplied to a word line in response to an input signal at device logic level. For example, in fairly typical values for a NAND type FLASH memory, 10-30V is provided on a word line in response to an input going from ground to "high" value of VDD in the ~2-5V range for typical current devices. Such level shifters that are capable of handling such high voltages find use in multiple places in the peripheral circuitry of programmable non-volatile memories. To improve the operation of the circuit, it is important that the voltage on the output reaches its full value quickly when enabled and also that level shifter turns off quickly when disabled. Many designs exist for such switches. A number of common designs use an NMOS transistors and a local charge pump to raise the gate voltage values used to turn on the transistor and pass the high voltage from the source to the output. Such level shifters have typically been designed to only pass positive voltages. In some applications, including some non-volatile memory designs, there is also a need to pass negative voltages. Consequently, there is an ongoing need for level shifter circuits capable of handling high voltages and also to pass negative voltages.

SUMMARY OF THE INVENTION

According to a general set of aspects, a level shifter circuit is presented. The level shifter circuit is connectable to receive an input voltage at a first node, to receive an enable signal, and to supply an output voltage at a second node. The level shifting circuit includes: a first depletion type NMOS transistor connected between the first node and a first internal node and having a gate connected to the second node; a first PMOS transistor connected between the first internal node and the second node and having a gate connectable to receive the enable signal; an inverter connectable to receive the enable signal and provide as output an inverted enable signal; and a negative voltage section connectable to receive a negative voltage level at a third node. The negative voltage section includes: a second PMOS transistor connected between the enable signal and a second internal node; a first NMOS transistor connected between the second internal node and third node; a third PMOS transistor connected between the inverted enable signal and a third internal node; and a second NMOS transistor connected between the third internal node and third node. The control gates of the second and third PMOS transistors are connected to ground, the second internal node is connected to the gate of the second NMOS transistor, and the third internal node is connected to the gate of the first NMOS transistor and the second node.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 5 and 6 are a set of waveforms illustrating the operation of the circuit of FIG. 4.

DETAILED DESCRIPTION

Level shifters find many applications in integrated circuits when there is a need to provide a particular voltage at a given node in response to an enable signal. For example, they frequently occur as part of the peripheral circuitry on non-volatile memory devices where they may need to supply some of the fairly high voltage levels, such as in the 10-30 volt range, used in such devices. Examples of such non-volatile memory devices are described in U.S. Pat. Nos. 5,570,315, 5,903,495, and 6,046,935 and U.S. patent application Ser. No. 12/895, 457. For example, a specific example of a switch where such a level shifter can be used is presented in U.S. patent application Ser. No. 12/895,476. For some designs of non-volatile memories, as well as in level shifter applications, there is also a need to drive a negative voltage. In such a situation, for the level shifter needs to be able to realize a negative level, being both a high voltage level shifter for selected word lines and also to drive a negative level for unselected memory blocks; and when enabled for a selected block, it can still drive a positive high voltage level to word line decode transistors.

Figure 1:
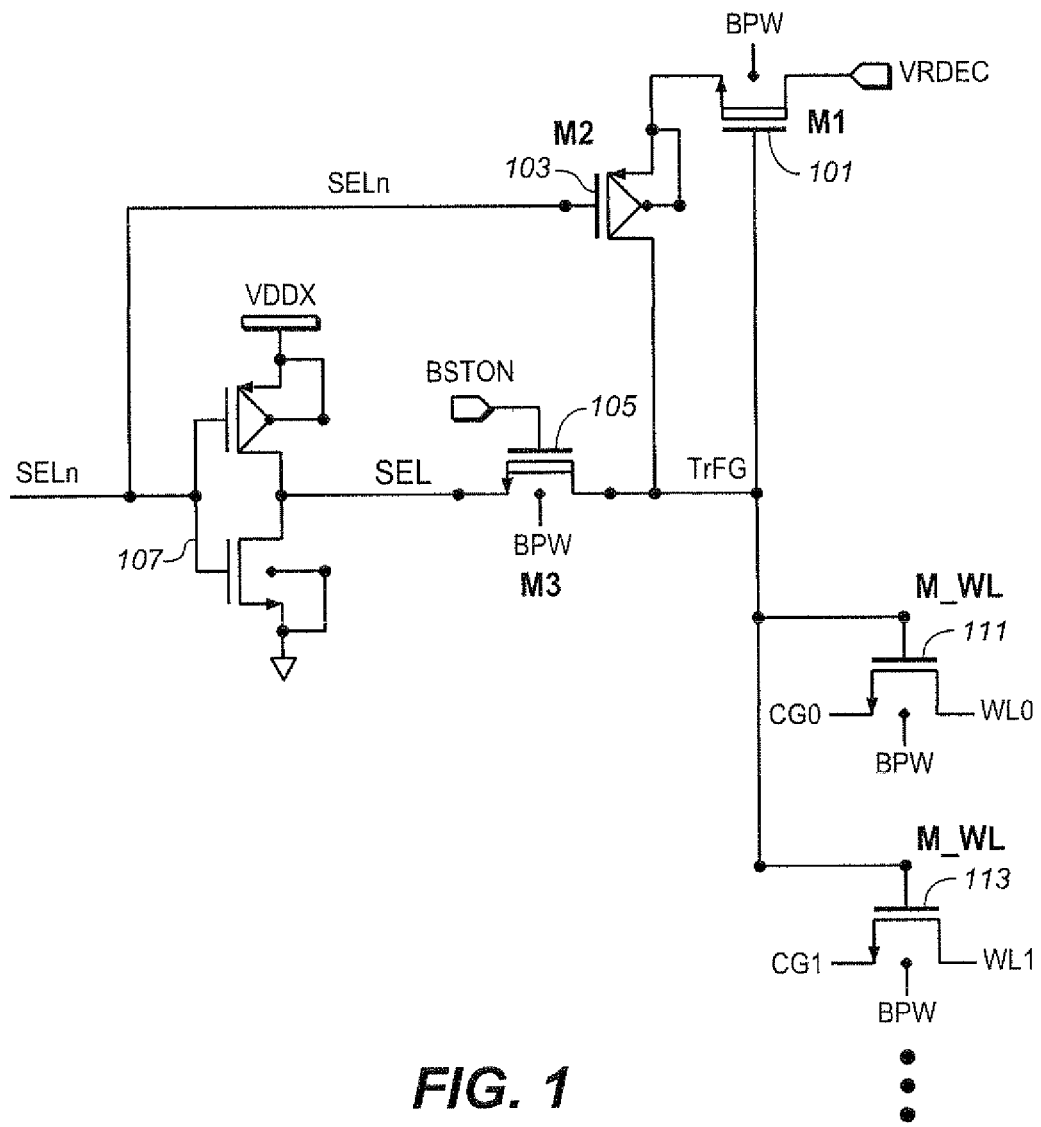
FIG. 1 is a circuit diagram of a level shifter.

To provide some context, an example of a high voltage level shifter such as would be used for word line decoding in a non-volatile memory is shown in FIG. 1. As shown in FIG. 1, level shifting circuit is connected to receive an enable signal SEL (or, here, its inverted version SELn) at left and a high voltage VRDEC at upper right. The output is at TrFG, which is here provided to the gates of transistors used in word line decoding (M_WL 111, 113, . . . ). A depletion type NMOS M1 101 is connected in series with a PMOS M2 103 between the high voltage input VRDEC (here a decoding voltage) and the output node TrFG. Both M1 101 and M2 103 need to be able to handle the voltage at VRDEC. The gate of M1 101 is connected to the output node and the gate of PMOS M2 103 receives SELn. The signal SELn is also connected to the inverter 107 (a PMOS and NMOS connected in series between the supply level VDDX and the low level), which then supplies the inverter version SEL through the depletion type device M3 105 to the output node TrFG, where the gate of M3 is controlled by a level BSTON.

In this example, the high voltage level shifter design is to transfer a high voltage (HV) from a charge pump to word line decoding elements of a non-volatile memory. When a memory block is selected, the high voltage (VRDEC) is passed through a series connected HV NMOS M1 101 and the HV PMOS M2 103 devices to control the gates of HV NMOS switches for word line decoding (M_WL 111, 113, . . . ). This lets the circuit to pass the high voltage from the pre-decoding circuitry to the word lines of a selected block. When a block is un-selected, the node TrFG is reset to VSS, with all of the high voltage NMOS of the word line decoding (M_WL) off, so that all word lines in an un-selected block are floating. All of the bulks (BPW) of the high voltage NMOS are connected to VSS. No triple well process required in this arrangement.

Figure 2:
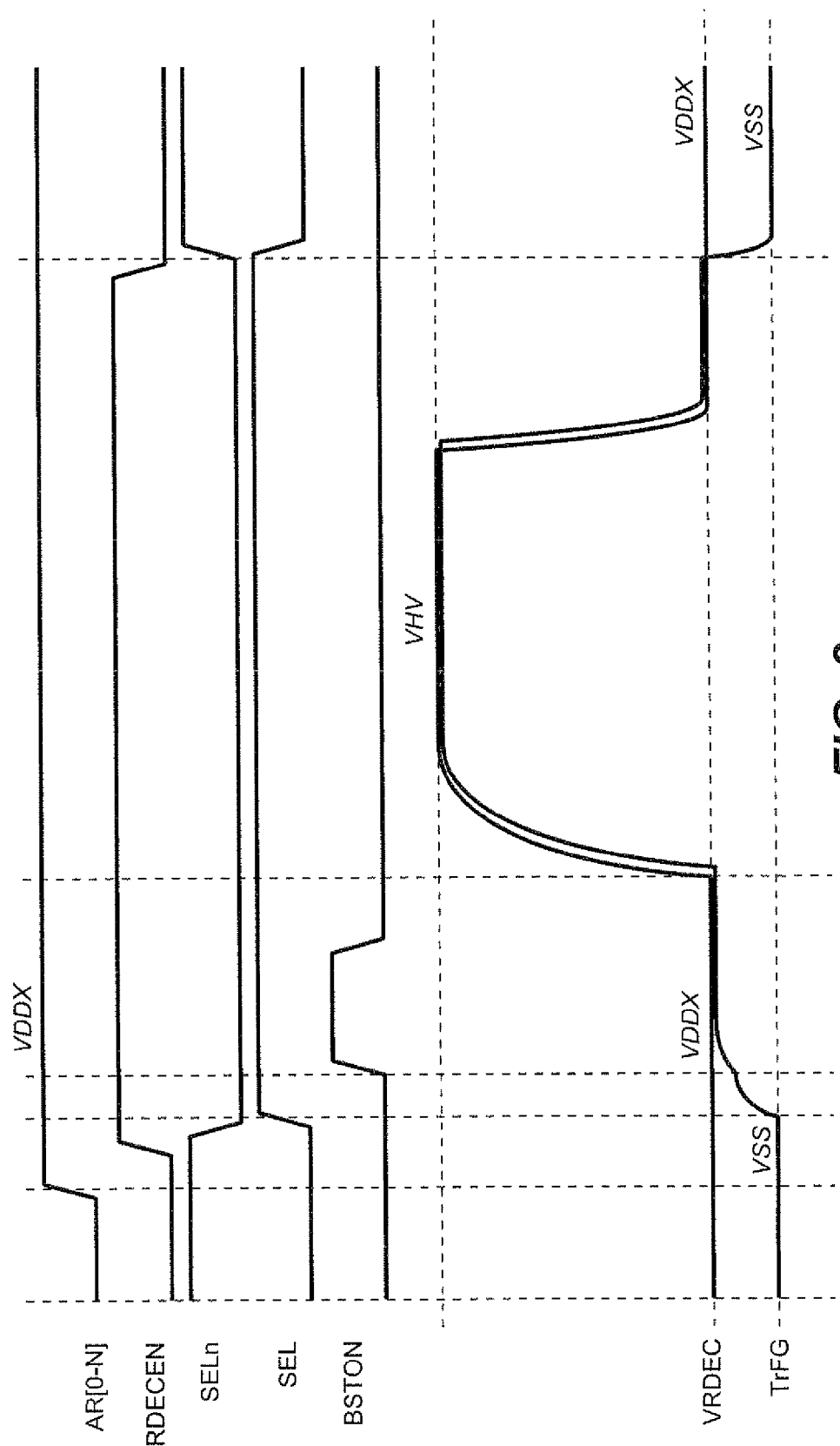
FIGS. 2 and 3 are a set of waveforms illustrating the operation of the circuit of FIG. 1.

The operation of the circuit of FIG. 1 to enable a selected block can be illustrated with respect to FIG. 2. In FIG. 2, the top line AR[0-N] corresponds to pre-decoded address signals determining whether a block is selected and the second line RDECEN is used to enable the level shifting circuits. Initially, these selection/enable signals are low (VSS) and the output node TrFG is also low. VRDEC is initially at the high (VDDX) level. When the word line address pre-decoded signals (AR[0-N]) are all logic high and when RDECEN is the enabling, SELn is pulled to low (VSS) and SEL is at the high (VDDX) level. Before a BSTON pulse comes, due to M3 105 being a HV NMOS depletion type device with a negative threshold voltage (Vt), node TrFG begins charging up. As the BSTON pulse arrives, TrFG is pre-charged to the VDDX level. At this point, as SELn is low and TrFG is high, both M1 101 and M2 103 are on. The output node TrFG will then self boost to the VRDEC level through a series of M1 101, also a HV NMOS depletion type device, and HV PMOS M2 103, as its gate is connected to SELn=VSS. BSTON is then taken low. When the system applies a high voltage level VHV at the input, this is then passed to the output node TrFG, and then to all M_WL switches 111, 113, . . . in the selected block to fully pass word line drivers to the corresponding word lines.

Figure 3:
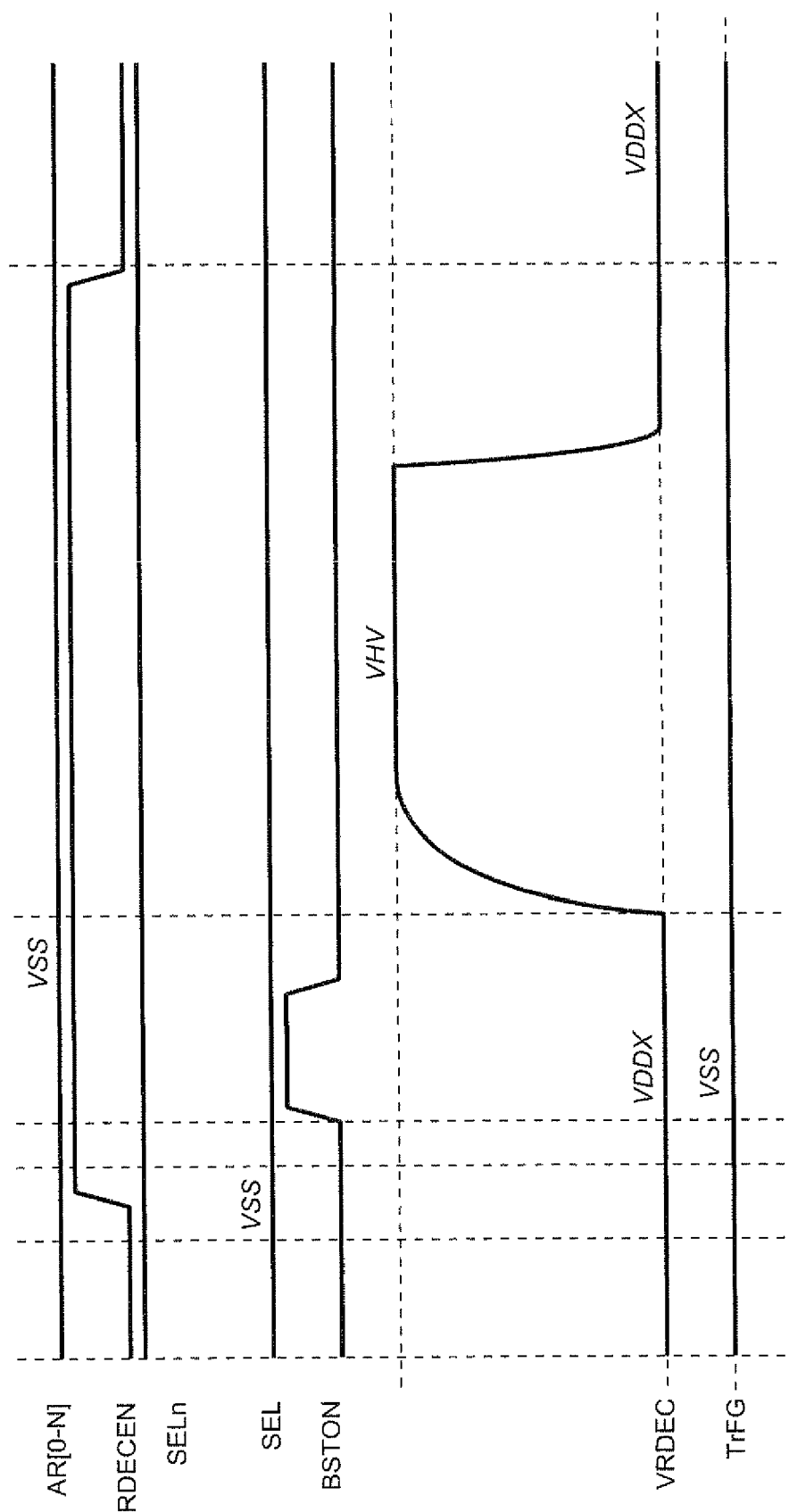

FIG. 3 again corresponds to the operation of FIG. 1, but in the case for an un-selected block. In this case, since the block is non-selected, as at least one of the AR[0-N] signal is low, so that when RDECEN goes high SELn is kept high and SEL is VSS. M3 105 is a HV NMOS depletion type with negative Vt, and thus TrFG is driven by SEL to VSS. In this case, both M1 101 and M2 103 are off, so that when VRDEC goes to VHV, TrFG stays low. Consequently, the level shifter will apply the VSS level from TrFG to all M_WL switches 101, 103, . . . in order to cut off the word lines in the unselected block from the drivers.

Figure 4:
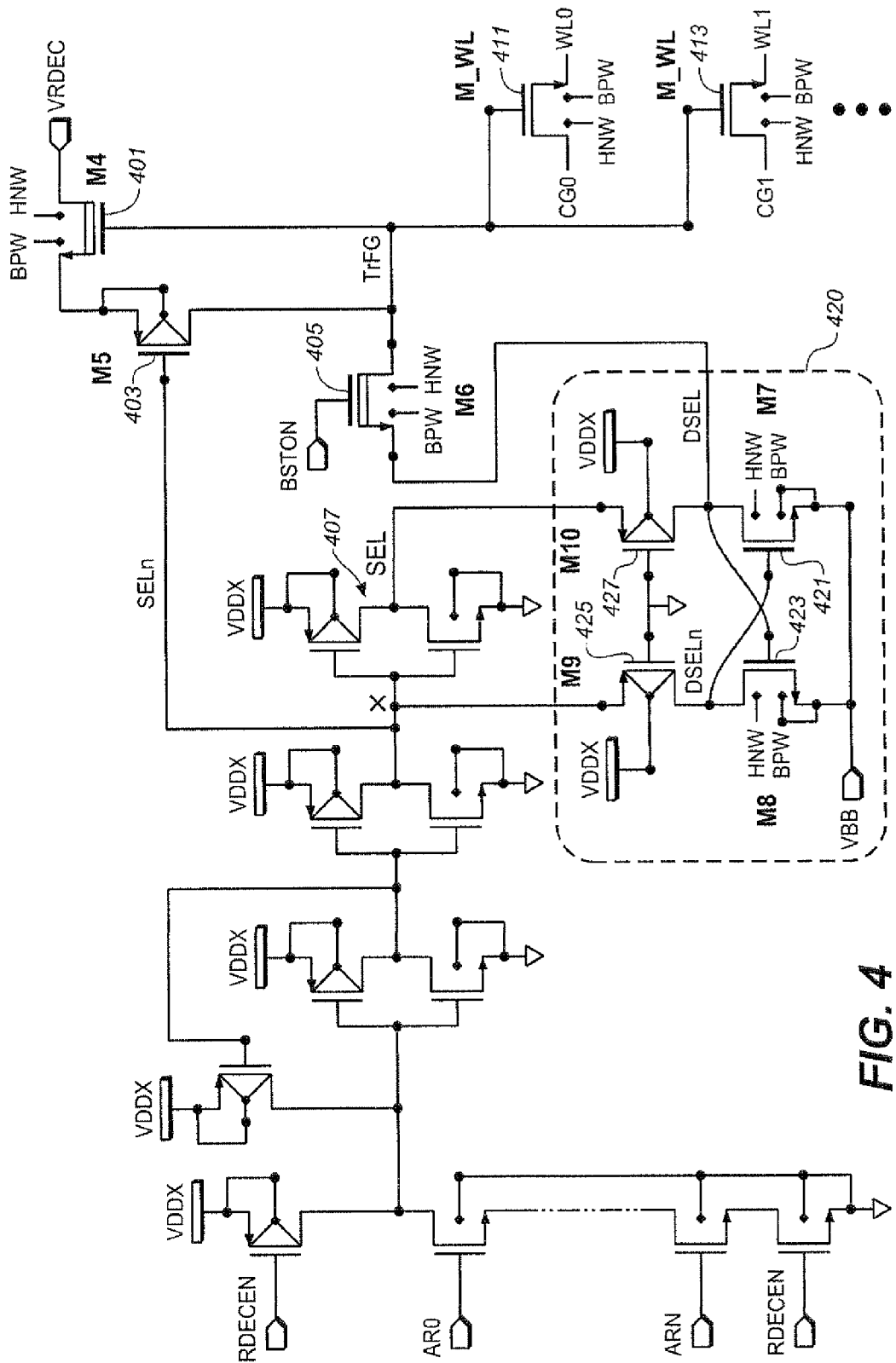
FIG. 4 is an exemplary embodiment of a level shifter employing aspects described herein.

Consequently, an arrangement such as in FIG. 1 can apply a high positive voltage to selected blocks and also drive non-selected blocks at ground. In some applications, though, there is a need to be able to apply a negative voltage level to non-selected blocks while still being able to drive a high positive level when selected. For example, by applying a negative level at non-selected blocks may allow the avoidance of higher programming voltages or other advantages. A typical design for such a level shifter requires the use of a high voltage pfet to avoid device breakdown. As a non-volatile memory device may need thousands of such level shifters, it is desirable for these to have a small area and, hence, to avoid the use of high voltage devices when possible. FIG. 4 presents an exemplary embodiment of a negative level shifter that is not susceptible to low voltage pfet breakdown. This allows for a high voltage level shifter (transfer gate) that can drive a negative level for unselected blocks and, when enabled for a selected block, can still drive a positive high voltage level to the word line decoding M_WL transistors.

As with the circuit of FIG. 1, the level shifter of FIG. 4 again receives an enable signal (or its invers) SELn at left, an input voltage VRDEC at upper right, and provides its output at to TrFG, where it is again used to supply the gates of the word line decode switches M_WL 411, 413, . . . . To the left of the node X, the inputs of some of the addressing and selection signals (AD[0-N], RDECEN) is also now explicitly shown, along with some intervening inverters or half-latches for isolation purposes. The high voltage depletion NMOS M4 401, high voltage PMOS M5 403, depletion type NMOS M6, and inverter 407 arranged much as is FIG. 1. In contrast to FIG. 1, rather than the inverter 407 supplying the signal SEL to NMOS M6 405, M6 now receives a signal DSEL that comes from the negative voltage section 420. The negative voltage section 420 is connected to receive a negative level at VDD. Under this arrangement, the output node TrCG can either be at a high voltage supplied at VRDEC for a selected block or at the negative level for a non-selected block.

The negative voltage section 420 includes a first leg of a PMOS M9 425 and an NMOS M8 423 connected in series between SELn at the top and VDD at the bottom and a second leg of a PMOS M10 4257 and an NMOS M7 421 connected in series between SEL at the top and VDD at the bottom. The gates of the PMOS devices M9 425 and M10 427 at set at ground. The gates of the NMOS devices M7 421 and M8 423 in each leg have their gates connected to the intermediate node of the other leg, DSELn and DSEL respectively. It is then the value of DSEL (rather than SEL in FIG. 1) that is supplied to M6 405.

The arrangement of FIG. 4 is able to use low voltage PMOS transistors M9 425, M10 427 with their LV n-well connect to same high supply level (VDDX) as the other PMOS devices to minimize decoding area. (In alternate embodiments, the single PMOS devices M9 425, M10 427 can each be replaced with two or more PMOS devices connected is series.) The source side of PMOS M9 425 is connect to SELn, and the source side of PMOS M10 427 is connected to SEL, while gates of both M9 425 and M10 427 are connected to the low level VSS to prevent thin oxide break down. In this example, the negative voltage level VBB can be about −4V, so that the devices M8 423 and M7 421 are selected as high voltage NMOS with triple well process and positive Vt devices. M6 405 and M4 401 are selected as HV NMOS with triple well and negative Vt, and the switches M_WL 411, 413, . . . are HV NMOS selected as triple well, positive Vt devices. All bulk levels (BPW) of the HV NMOS are connected to VBB or a negative bias to prevent forward bias at PN junctions. The HN wells (HNW) are connected to VDDX or a positive bias.

The PMOS transistors M9 425, M10 427 are low voltage device in that they can be thin oxide devices that allow having small channel length and width for switching speed and require relatively small drawing layout area. (Low voltage devices are typically used as logic gates in peripheral circuitry.) An advantage of being able to use such low voltage devices here is that this arrangement allows the circuit to connect the nwell of these PMOS devices to VDDX, the same as other low voltage PMOS transistors in the design, so that they can share the same n-well layout while their drain-source voltage (Vds) does not exceed the maximum Vds allowance of low voltage transistors, often ~4V or even down to the ~2V to ~3V range. In a typical application, such as on a non-volatile memory device, the circuit can have many thousands of such blocks on the chip, and this design is repeated a corresponding number of times. As M5 403 needs its own HV-Nwell, it would be a large layout area penalty if the circuit also needed to use HV PMOSs at M9 425, M10 427, or additional devices with different Nwells.

Figure 5:
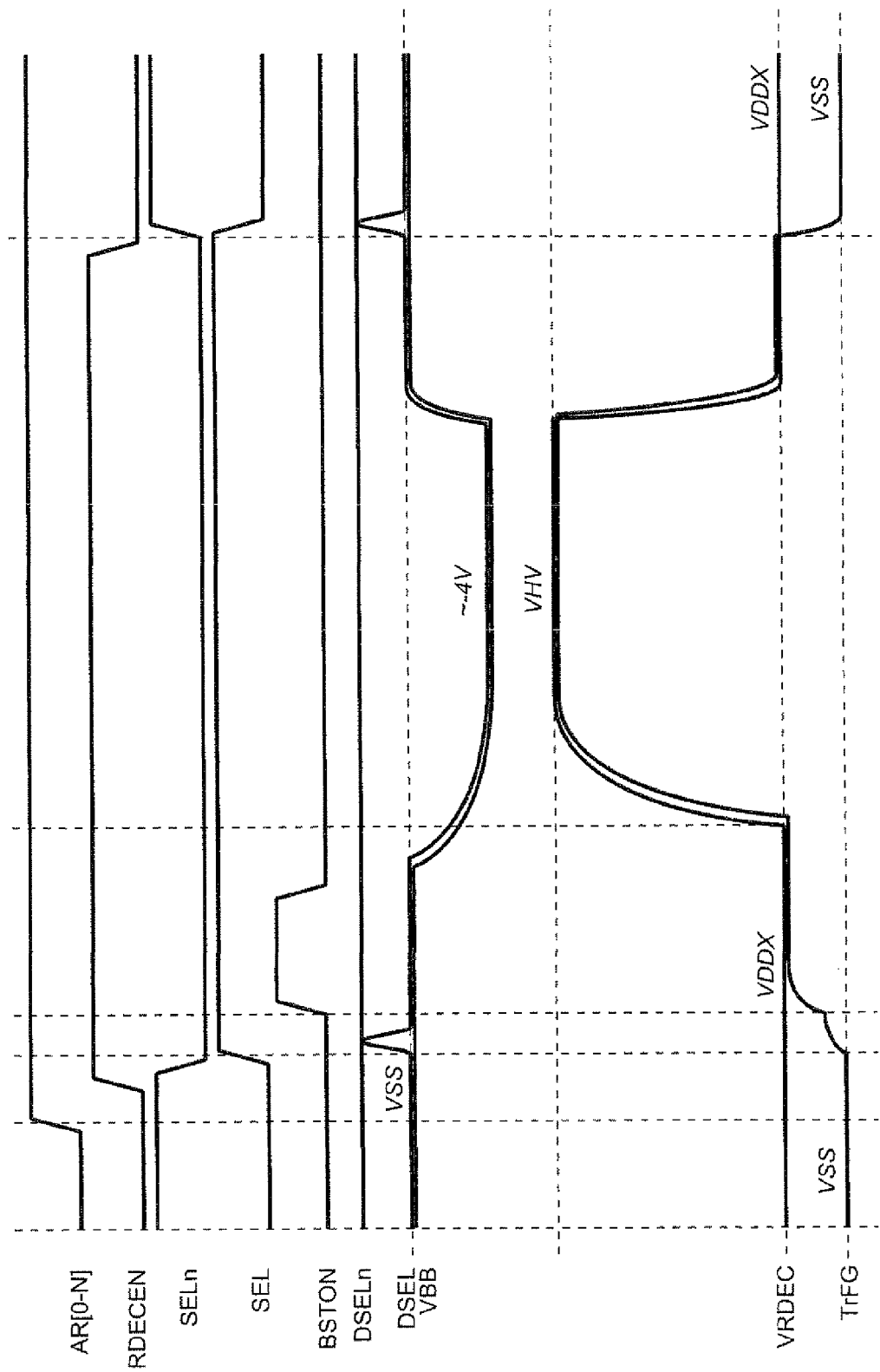

The operation of FIG. 4 can be illustrated by FIGS. 5 and 6 for the selected and non-selected case, respectively. FIG. 5 is the selected block case for FIG. 4, corresponding to FIG. 2 in the case of FIG. 1. The input AR[0-N], RDECEN timing are the same as in FIG. 2. When SELn is pulled to VSS and SEL to VDDX, PMOS M9 425 is off and PMOS M10 425 pulls node DSEL up from VSS to VDDX, while, as DSEL rising, HV NMOS M8 423 is turned on and pulls DSELn to VBB, which at this moment is at the VSS level. HV NMOS M7 421 is turned off once DSELn is low. When VBB ramps down to a negative level (~4v, for example), the cross coupled pair of transistors M9 425 and M10 427 will help take DSELn to the VBB level. Since the gate of M9 425 is connected to VSS, |Vgd| of M9 is VBB, about 4v, and thus well below the gate oxide limit. As with FIGS. 1 and 2, TrFG is pre-charge to the VDDX level through M6 405 and self boosted to VRDEC level (VHV) through the series of the M4 401 HV NMOS and the M5 403 HV PMOS. Once the system completes the operation, VBB is then discharge back to VSS and other reset sequences are the same as previous approach.

FIG. 6 illustrates the operation of FIG. 4 for an unselected block, when the output node is taken to the negative level. The input signals AR[0-N], RDECEN timings are the same as in FIG. 3. When SELn is charged up to VDDX and SEL is pulled down to VSS, PMOS M9 425 is on and pulls node DSELn to VDDX. DSEL reset to VSS through HV NMOS M7 421 as VBB is still at VSS. When VBB the ramps down to a negative level (here ~4v), the same cross coupled pair of transistors M9 425 and M10 427 will help take DSEL to the VBB level. This negative VBB (−4v) then passes through HV NMOS M6 405 to the TrFG node. The negative level (−4v) at TrFG will turn off all the M_WL decode devices (411, 413, . . . ) and prevent word lines in unselected block seeing negative potential for word line drivers. When DSEL has a negative VBB value, as the gate of M10 427b is connected to VSS, |Vgd| of M10 is about −4V and below the thin oxide breakdown limit of low voltage pfet devices.

Consequently, the arrangement of FIG. 4 addresses the requirement for a negative level shifter. To realize a negative potential applied at word lines for any needed operation, the system can use this level shifter in each of its blocks to transfer a negative (for example about −4V) level to turn off all word lines decode transistors in unselected blocks. By using a pair of low voltage PMOS device whose n-wells share the same level as other PMOS transistors in the design, layout area can be minimized. The gates of this pair of PMOSs are connected to VSS, thereby preventing these low voltage PMOS devices from thin oxide breakdown.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

The invention claimed is:

1. A level shifter circuit connectable to receive an input voltage at a first node, to receive an enable signal, and to supply an output voltage at a second node, the level shifting circuit comprising:
a first depletion type NMOS transistor connected between the first node and a first internal node and having a gate connected to the second node;
a first PMOS transistor connected between the first internal node and the second node and having a gate connectable to receive the enable signal;
an inverter connectable to receive the enable signal and provide as output an inverted enable signal; and
a negative voltage section connectable to receive a negative voltage level at a third node, including:
a second PMOS transistor connected between the enable signal and a second internal node;
a first NMOS transistor connected between the second internal node and third node;
a third PMOS transistor connected between the inverted enable signal and a third internal node; and
a second NMOS transistor connected between the third internal node and third node,
wherein the control gates of the second and third PMOS transistors are connected to ground, the second internal node is connected to the gate of the second NMOS transistor, and the third internal node is connected to the gate of the first NMOS transistor and the second node.

2. The level shifter circuit of claim 1, wherein the substrates of the second and third PMOS transistors are connected to a high on-chip supply level.

3. The level shifter circuit of claim 1, wherein the substrate of the first PMOS transistor is connected to the first internal node.

4. The level shifter circuit of claim 1, a second depletion type NMOS transistor connected between the third internal node and the second node.

5. The level shifter circuit of claim 4, wherein the second depletion type NMOS transistor is a triple well CMOS process devices whose n-well is connected to a high on-chip supply level.

6. The level shifter circuit of claim 1, wherein the level shifter circuit is formed as a peripheral circuit on a non-volatile memory circuit.

7. The level shifter circuit of claim 6, wherein in the output voltage is a word line decoding voltage.

8. The level shifter circuit of claim 7, wherein in the output voltage is supplied to one or more high voltage NMOS devices that are triple well CMOS process devices whose n-well is connected to a high on-chip supply level.

9. The level shifter circuit of claim 1, wherein the second and third PMOS devices are low voltage devices.

10. The level shifter circuit of claim 1, wherein setting the output voltage at the second node comprise:
having the enable signal either asserted or de-asserted value;
subsequently receiving the negative voltage level at the third node and a high positive voltage at the first node, whereby in response to the enable signal being asserted the output voltage is set to the high positive voltage and in response to the enable signal being de-asserted the output voltage is set to the negative voltage level.

11. The level shifter circuit of claim 10, wherein when asserted the enable signal is high and when de-asserted is low.

12. The level shifter circuit of claim 10, a second depletion type NMOS transistor connected between the third internal node and the second node.

13. The level shifter circuit of claim 12, wherein setting the output voltage at the second node further comprises:
subsequent to having the enable signal either asserted or de-asserted value and prior to receiving the negative voltage level at the third node and a high positive voltage at the first node, raising the gate of the second depletion type NMOS transistor from a low value to a high value and subsequently back to the low value.

14. The level shifter circuit of claim 1, wherein the first depletion type NMOS transistor and the first and second NMOS transistors are triple well CMOS process devices whose n-well is connected to a high on-chip supply level.

* * * * *